United States Patent [19]
Paoli

[11] Patent Number: 5,513,200
[45] Date of Patent: Apr. 30, 1996

[54] MONOLITHIC ARRAY OF INDEPENDENTLY ADDRESSABLE DIODE LASERS

[75] Inventor: Thomas L. Paoli, Los Altos, Calif.

[73] Assignee: Xerox Corporation, Stamford, Conn.

[21] Appl. No.: 49,897

[22] Filed: Apr. 20, 1993

Related U.S. Application Data

[63] Continuation-in-part of Ser. No. 948,524, Sep. 22, 1992, Pat. No. 5,412,678.

[51] Int. Cl.⁶ ................................ H01S 3/18; H01S 3/25
[52] U.S. Cl. ........................................... 372/50; 372/34
[58] Field of Search ................... 372/50, 45, 46, 372/34, 36

[56] References Cited

U.S. PATENT DOCUMENTS

| | | | |
|---|---|---|---|
| 4,069,463 | 1/1978 | McGroddy et al. | 331/94.5 |
| 4,531,217 | 7/1985 | Kitamura | 372/50 |
| 4,701,927 | 10/1987 | Naka et al. | 372/46 |
| 4,870,652 | 9/1989 | Thornton | 372/50 |
| 4,916,710 | 4/1990 | Hattori | 372/50 |
| 5,022,035 | 6/1991 | Hasegawa | 372/36 |
| 5,157,680 | 10/1992 | Goto | 372/50 |

FOREIGN PATENT DOCUMENTS

| | | | |
|---|---|---|---|
| 0006789 | 1/1979 | Japan | 372/50 |
| 0204292 | 11/1984 | Japan | 372/34 |
| 0102386 | 5/1988 | Japan | 372/43 |
| 0281786 | 11/1989 | Japan | 372/43 |
| 2-56986 | 2/1990 | Japan | 372/50 |
| 0225985 | 10/1991 | Japan | 372/45 |
| 5-235486 | 9/1993 | Japan | 372/43 |

*Primary Examiner*—Rodney B. Bovernick
*Assistant Examiner*—Robert McNutt
*Attorney, Agent, or Firm*—John M. Kelly; Leslie A. Weise

[57] ABSTRACT

A monolithic array of two or more independently addressable, closely spaced diode lasers having low thermal, electrical, and optical crosstalk. An isolation groove is formed between the adjacent laser elements, which are defined by rib loaded waveguides created by etching mesas above a planar active multilayer waveguide. Separate electrical connections to the ribs, and a common electrical connection to the substrate, enable individual addressing of each laser element. Selectively added blocking layers and/or insulating layers are added to the structure to provide improved electrical and/or thermal isolation.

11 Claims, 5 Drawing Sheets

MONOLITHIC ARRAY OF INDEPENDENTLY ADDRESSABLE DIODE LASERS

This application is a continuation-in-part of application Ser. No. 07/948,524, filed 22 Sep. 1992 and entitled, "Multi-Beam Orthogonally-Polarized Emitting Monolithic Quantum Well Lasers now U.S. Pat. No. 5,412,678."

The present invention relates to the design and the fabrication of closely spaced, independently addressable diode lasers.

BACKGROUND OF THE PRESENT INVENTION

Monolithic arrays of closely spaced, independently addressable semiconductor lasers are important light sources for applications such as optical disk recorders, laser printers, and fiber optic communication systems. With such laser arrays it is generally desirable to pack the laser elements as densely as possible. However, closely spaced laser elements are difficult to electrically connect and heatsink (cool). Furthermore, closely spaced laser elements tend to interact electrically, optically, and/or thermally. These interactions, called crosstalk, are usually undesirable.

A partial solution to the crosstalk problem is disclosed in U.S. Pat. No. 4,069,463, issued 17 Jan. 1978 to McGroddy et. al. and entitled "Injection Laser Array." That patent teaches mounting the laser elements in close electrical and thermal contact with a thermally and electrically conductive beam lead located in a substrate of insulating material. While the beam leads individually heatsink the laser elements, the beam leads are electrically isolated from each other. In the '463 patent, each laser element is defined and isolated from its neighbors by a groove through the epitaxial layers of the laser structure. Although the teachings of the '463 patent enable the fabrication of separately addressable and heatsinked laser elements, its successful implementation may be excessively complex.

Another partial solution to the crosstalk problems is taught in U.S. Pat. No. 4,531,217, issued 23 Jul. 1985 to Kitamura and entitled "Semiconductor Laser Device With Plural Light Sources." According to that patent, each laser element is mounted in close electrical and thermal contact with a common electrode on a homogeneous heatsinking submount. Physical separation of each laser element is provided by a groove through the substrate of the laser chip near the element's active layer. Each laser element is electrically addressed by individually contacting sections of the substrate between the grooves. Although this approach heatsinks the laser array, it may not provide adequate electrical isolation.

U.S. Pat. No. 4,916,710, issued 10 Apr. 1990 to Hattori and entitled "Multi-Point Emission Type Semiconductor Laser Device Therefor," teaches using a groove to electrically isolate laser elements from their neighbors. The groove cuts through the epitaxial layers of the laser structure and into a previously formed protrusion on the laser's substrate. Since the substrate is insulating, the groove isolates each laser element. Electrical contact to the substrate side of each laser element is achieved by removing the non-protruding regions of the substrate in order to access the first epitaxial layer, which is conducting. Electrical contact to the other side of each laser element is made with a single electrode that also serves as a heatsink. Although electrical isolation and heatsinking are both possible in a structure based upon the '710 patent, such a structure is believed to be rather complicated. In addition, since each contact on the substrate side must be large enough to accommodate a wire, the required distance between protrusions increases the minimum separation between the laser elements to a rather large value, especially if the laser array contains more than two elements. Finally, removing significant portions of the substrate, as is believed required in the subject structure, weakens the structural integrity of the laser chip, thus making it susceptible to breakage.

Another approach to alleviating the complexities of electrically addressing closely spaced elements in a diode laser array is disclosed in U.S. Pat. No. 4,870,652, issued 26 Sep. 1989 to Thornton and entitled "Monolithic High Density Arrays of Independently Addressable Semiconductor Laser Sources." In the '652 patent, the substrate side of the laser array is attached either to a submount or directly to a mounting surface of the final package. With the laser chip orientated as such, the separate electrical contacts on the epitaxial layers of each laser element remain exposed and accessible for individual electrical connections. However, this approach provides relatively poor heatsinking through the substrate, and therefore requires exceptional laser performance. While such performance has been obtained with laser elements fabricated by impurity induced layer disordering, it is not generally available with lasers utilizing other fabrication methods or designs. A consequence of the use of impurity induced disordering is that the state of the art currently restricts its use to wavelengths longer than about 750 nm. Such a wavelength limitation undesirably limits the uses of the laser arrays.

Accordingly, there is a need for designs and fabrication techniques which enable low crosstalk in closely spaced (dense) arrays of diode lasers. Beneficially those designs and fabrication techniques should be applicable to laser arrays having elements which emit light with wavelengths shorter than about 750 nm.

SUMMARY OF THE INVENTION

The present invention enables monolithic arrays of closely spaced, independently addressable diode lasers to have low thermal, electrical, and optical crosstalk. According to one embodiment, an isolation groove separates laser elements that are defined by rib loaded waveguides formed by etching mesas above a planar active multilayer waveguide. In a second embodiment, the laser elements are defined and separated as in the first embodiment, but an additional, selectively added, blocking layer of opposite conductivity is added. In a third embodiment, the laser elements are defined as in the second embodiment, but with the addition of a contacting layer formed over the blocking layer and over the exposed tops of the mesas. The isolation grooves are beneficially etched from a top epitaxial layer into a substrate.

In the various embodiments the top surfaces of the laser array structures are beneficially planarized by filling around the mesas and the isolation groove with an electrical insulator, preferably one that is also a thermal insulator. A separate electrical contact is made to each rib for its associated laser element, while the substrate, attached to a mounting surface, provides a common electrical connection for the laser elements. In practice, the laser elements are beneficially longer than about 300 μm, and the active layer is strained (so as to lower the laser threshold current).

A principal object of this invention is to form a monolithic array of closely spaced, individually modulated diode laser elements such that the modulation of one laser element has a negligible effect on the optical power emitted by any other laser element.

It is a further aim of this invention to form a closely spaced array of noninteracting diode lasers without using impurity induced layer disordering.

Figure 1:
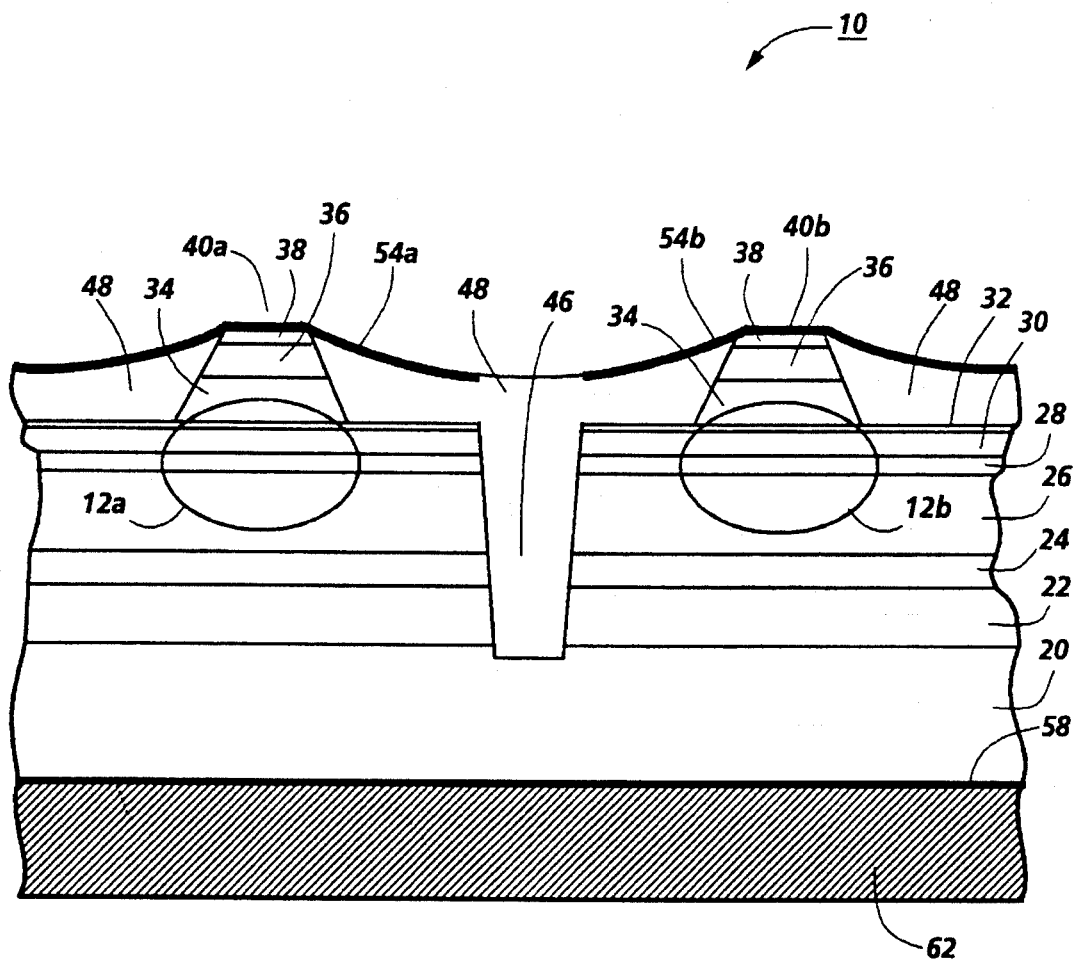
FIG. 1 shows a cross-sectional view of a first embodiment semiconductor laser array having two laser elements.

In general, throughout the figures, like reference numerals denote like components. A different numeral assigned to an analogous component implies that a change is made to that component. Components that have been numerically identified and described with reference to one figure are the same in the other figures.

DETAILED DESCRIPTION OF THE EMBODIMENTS

FIG. 1 shows a cross-sectional view of a first embodiment semiconductor laser array 10 according to the present invention. The laser array 10 has two independently addressable semiconductor laser elements 12a and 12b. The laser array 10 includes: a substrate 20 of n-GaAs upon which is epitaxially deposited a buffer layer 22 of n-GaAs; a transition layer 24 of n-Ga$_{0.5}$In$_{0.5}$P; a cladding layer 26 of Al$_{0.5}$In$_{0.5}$P; an active waveguide multilayer 28 (preferably undoped); a partial top cladding layer 30 of p-Al$_{0.5}$In$_{0.5}$P; an ultrathin etch stop layer 32 of p-Ga$_{0.5}$In$_{0.5}$P; a partial top cladding layer 34 of p-Al$_{0.5}$In$_{0.5}$P; and a transition layer 36 of p-Ga$_{0.5}$In$_{0.5}$P; and a cap layer 38 of p+GaAs.

The substrate 20 is misoriented with respect to its (100) direction in order to suppress spontaneous ordering of atomic planes during growth, thereby growing layers with the widest energy bandgap possible for their composition. The buffer layer 22 has a thickness in the range of 0.2 to 0.5 µm, the transition layer 24 has a thickness in the range of 0.1 to 0.3 µm, the cladding layer 26 has a thickness in the range of 0.5 to 1 µm, the cladding layer 30 has a thickness in the range of 0.2 to 0.4 µm, the etch stop layer 32 has a thickness in the range of 10 to 50 nm, the cladding layer 34 has a thickness in the range of 0.1 to 0.8 µm, the transition layer 36 has a thickness in the range of 0.1 to 0.5 µm, and the cap layer 38 has a thickness in the range of 20 to 100 nm.

The active waveguide multilayer 28 is comprised of a multiple (see below) quantum well heterostructure of active well layers of Ga$_x$In$_{1-x}$P or (Al$_x$Ga$_{1-x}$)$_y$In$_{1-y}$P separated by barrier layers of (Al$_{0.6}$Ga$_{0.4}$)$_{0.5}$In$_{0.5}$P and sandwiched between upper and lower carrier confinement layers of (Al$_{0.6}$Ga$_{0.4}$)$_{0.5}$In$_{0.5}$P.

Further, the active waveguide multilayer 28 has N, 2 to 20 nm thick active quantum well layers that are separated by N-1, 10 to 30 nm thick barrier layers sandwiched between 100 to 200 nm thick carrier confinement layers. N, preferably between 1 and 5, is chosen to minimize the threshold current density and its variation with temperature. An exemplary embodiment has two 8 nm thick active quantum wells of Ga$_{0.4}$In$_{0.6}$P (y=0.4) that are separated by a 12 nm thick barrier layer of (Al$_{0.6}$Ga$_{0.4}$)$_{0.5}$In$_{0.5}$P, all sandwiched between 140 nm thick carrier confinement layers of (Al$_{0.6}$Ga$_{0.4}$)$_{0.5}$In$_{0.5}$P. In this case x=0.4 is chosen to produce a compressively strained quantum well.

The laser elements 12a and 12b are defined by, respectively, ribs 40a and 40b that are formed by etching away the layers 34, 36 and 38 until the etch stop layer 32 is reached. Between the lasers elements is an isolation groove 46 (subsequently discussed in more detail). An planar insulating layer 48, comprised of an electrically insulating material such as polyimide or Si$_3$N$_4$, is formed by depositing the insulating material over the etch stop layer 32 and in the groove 46. Openings are formed through the insulating layer 48 to allow separate metallized electrical contacts 54a and 54b to be made to the ribs 40a and 40b.

In the laser array 10, the ribs 40a and 40b are between 2 and 4 µm wide, and have a center-to-center spacing in the range of 10 to 100 µm. The isolation groove 46 is wider than 2 µm. The maximum width of the ribs 40a and 40b is affected by the requirement that the laser emission be maintained in a fundamental spatial mode over the operating output power range.

To produce the laser array 10, a uniform epitaxial layer structure comprised of components 22(the buffer layer) through 38 (the cap layer) as described above is fabricated on a substrate 20. The ribs 40a and 40b are then formed by wet chemical etching, while the isolation groove 46 is formed between the laser elements either by reactive ion etching or by wet chemical etching. The insulating layer 48 is then applied over the entire structure and openings are created through it above the ribs 40a and 40b. A uniform metal contact 58 is then applied to the substrate, and separated metal contacts 54a and 54b are applied to the epitaxial side. The wafer is then broken into bars of laser arrays. The front and rear facets of the laser elements on the bars are then coated, and the bars are separated into individual arrays of two lasers each. Each laser array is then packaged with its substrate attached to a mount 62, and wires (not shown) are then attached to the exposed electrical contacts.

The laser elements 12a and 12b are spaced apart such that they 1) are readily focused onto an image plane, and 2) permit substantially independent control over the power emitted by each element. The second factor implies that the crosstalk between elements in the laser array 10 is minimized. Features which help reduce the crosstalk include:

- setting the center-to-center spacing between the elements to be the maximum allowed by the imaging optics that form and manipulate the emitted laser beams;

- choosing an isolation groove width that increases the optical, electrical, and thermal isolation between the adjacent laser elements without substantially affecting their performance;

- extending the isolation groove through the active layer 28 (preferably into the substrate 20);

- using a quantum well active layer composition and/or thickness that provides lasing emission at the longest wavelength allowed by the response of the (external) light receptor;

growing the quantum well active layer under compressive strain so as to achieve the lowest threshold density;

minimizing the temperature dependence of the lasing threshold density by applying a highly reflective coating to at least one facet of the laser cavity;

further minimizing the temperature dependence of the lasing threshold density by fabricating the laser cavity to be longer than 300 μm; and reducing the temperature sensitivity of the threshold current by forming more than one quantum well in the active waveguide.

A laser array 10 which achieves a crosstalk of less than 4% is comprised of 500 μm long laser elements that are spaced about 25 μm apart. A 13 μm wide groove is centered within the 25 μm. Each laser element emits light at about 680 nm from a front facet that has a halfwave coating. The rear facets are coated to reflect about 95% of the incident light. The laser elements include an active layer that contains two quantum wells of compressively strained $Ga_{0.4}In_{0.6}P$.

Figure 2A:
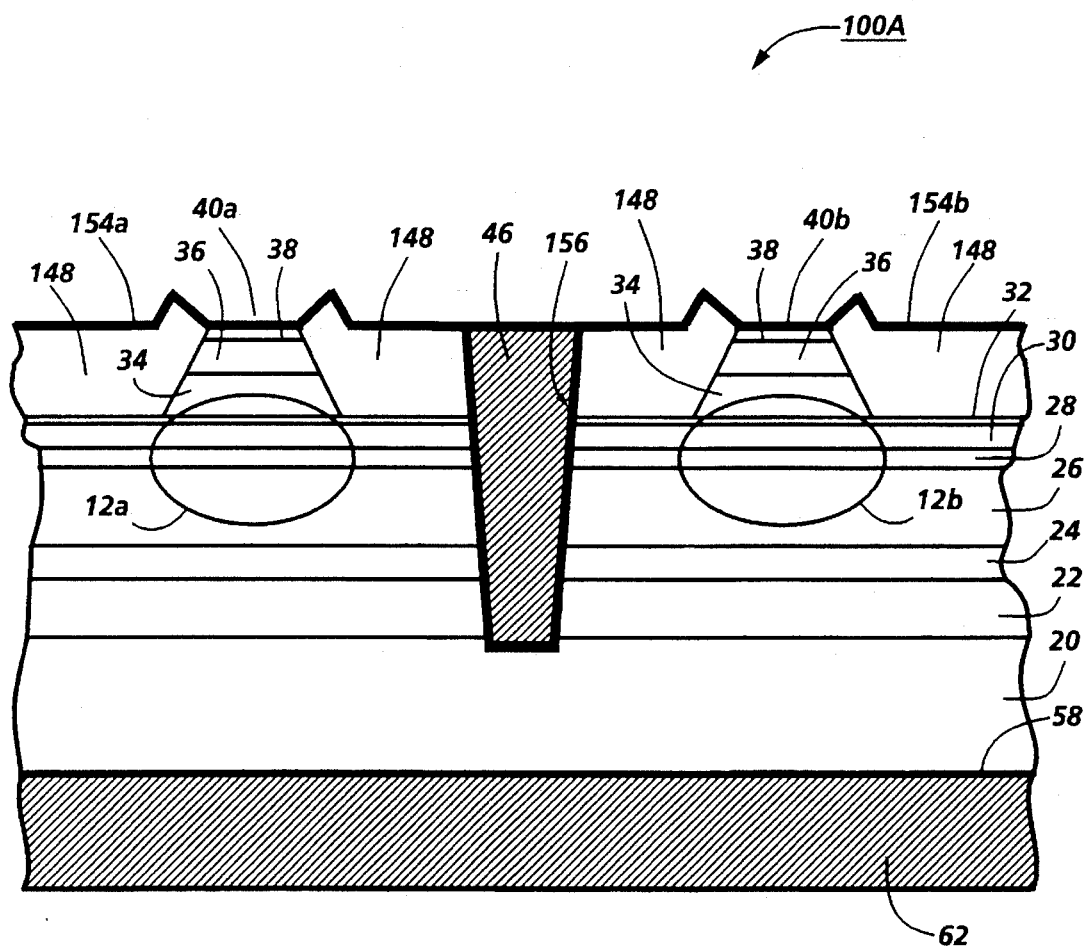
FIG. 2A shows a cross-sectional view of a second embodiment laser array having two laser elements and insulating material in the groove.
Figure 2B:
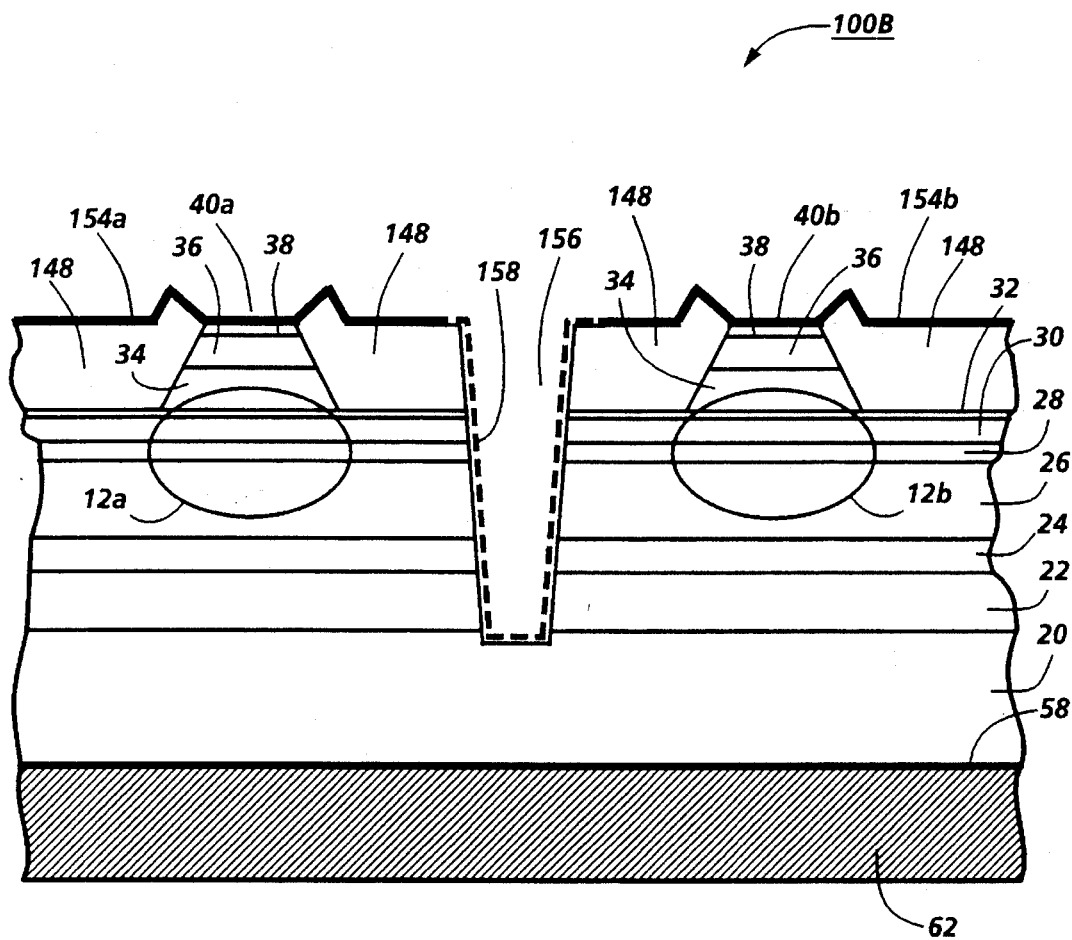
FIG. 2B shows a cross-sectional view of a second embodiment laser array having two laser elements and a protective coating in the groove.

FIGS. 2A and 2B show alternative embodiment laser arrays, the laser arrays 100A and 100B, respectively. The laser arrays are similar to the laser array 10 (FIG. 1) but they use blocking layers 148 comprised of an n-type layer of either GaAs, AlGaAs, or $Ga_{0.5}In_{0.5}P$ (see U.S. Pat. No. 4,792,958) instead of the insulating layer 48. The laser arrays 100A and 100B are formed similar to the laser array 10, the epitaxial layers 22, 24, 26, 28, 30, 32, 34, 36, and 38 are grown on the substrate 20, and then the ribs 40a and 40b are defined by etching using an etch mask. After etching of the ribs, but with the rib etch mask (not shown) in place, the blocking layer 148 is selectively grown over the ribs 40a and 40b and the etch stop layer 32. The rib etch mask prevents epitaxial growth over the ribs while permitting such growth on the etch stop layer 32 and over the exposed portions of the layers 34, 36, and 38 in the rib's sidewalls. The etch stop layer is then removed and electrical contacts 154a and 154b are deposited on the blocking layer 148 and on the cap layers 38 to enable individual addressing of each laser element.

The interface of the blocking layer 148 with the (p-doped) etch stop layer 32 forms a p-n junction that is reverse-biased when the laser active layer is forward-biased. Consequently, current from the contacts 154a and 154b are channeled through the ribs 40a and 40b and into the cladding layer 30.

After formation of the contacts 154a and 154b, an isolation groove 156 is formed through the layers 148, 32, 30, 28, 26, 24, and 22, and into substrate 20. A uniform metal contact 58 is then formed on the substrate. The isolation groove may be filled with an insulating material 46 (see FIG. 2A), such as polyimide, or it may be coated with a protective coating 158 (see FIG. 2B) of a material such as $Si_3N_4$.

In practice, the laser arrays 100A and 100B are manufactured on a wafer comprised of bars having a plurality of elements in much that same way as the laser array 10. After either filling the groove 156 with the insulating material 46 (FIG. 2A) or after application of the protective coating 158 (FIG. 2B), the bars are broken from the wafer and the front and rear laser facets are coated (not shown). The individual laser arrays are then separated from the bars and packaged with their substrate attached to a mount 62. Wires (also not shown) are then attached to the exposed electrical contacts 154a and 154b.

This laser arrays 100A and 100B have the advantage over the laser array 10 in that the blocking layer 148 increases the confinement of the laser mode, thereby enabling operation in a single spatial mode at higher power output. Further, the addition of the blocking layer 148 around the mesa ribs increases the structural integrity of the device. However, the laser arrays 100A and 100B are more complex since they require an additional epitaxial growth.

Figure 3:
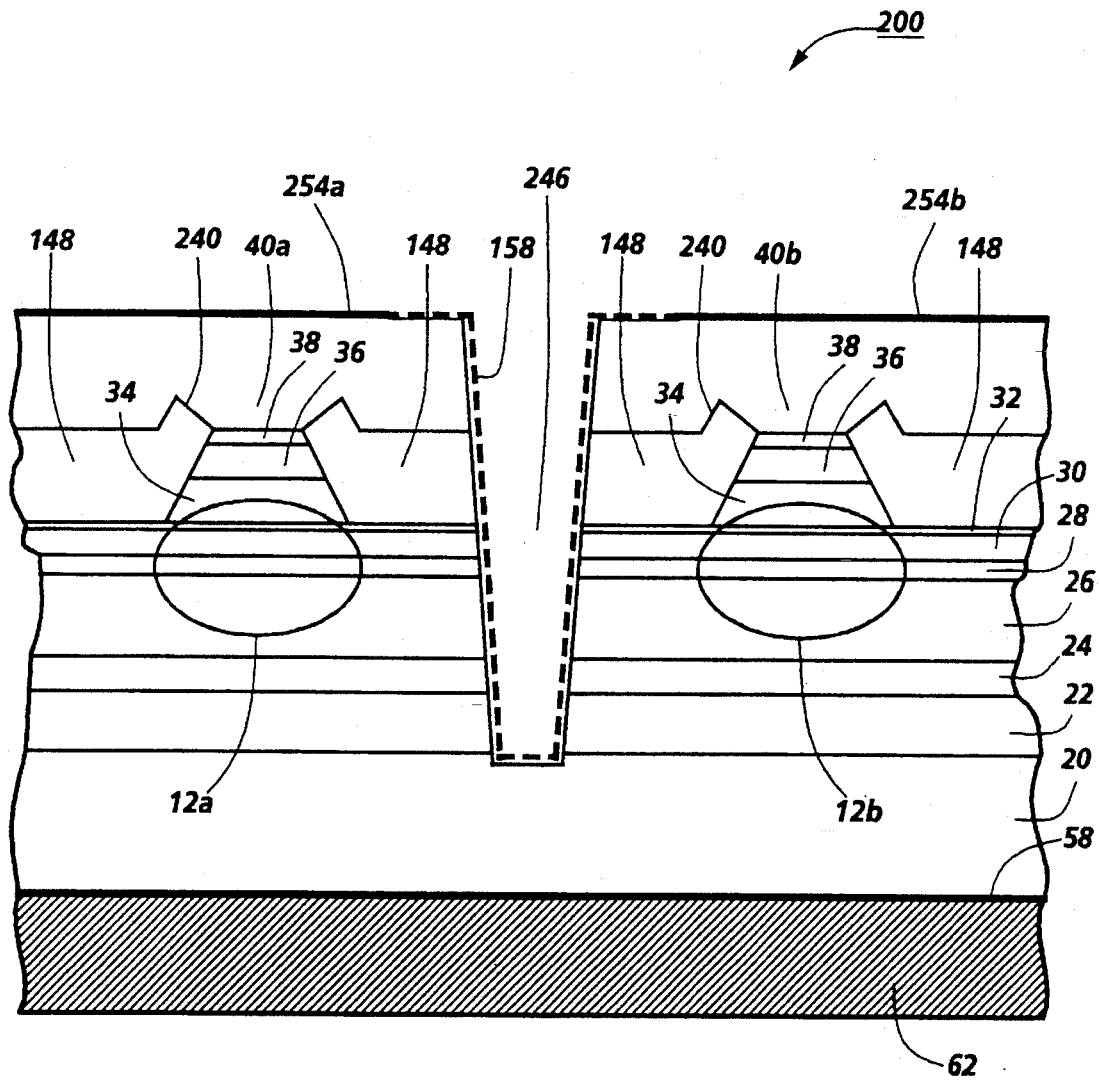
FIG. 3 shows a cross-sectional view of a third embodiment laser array having two laser elements.

FIG. 3 shows a third embodiment laser array 200 which includes a contact layer 240 made of p-type GaAs (see U.S. Pat. No. 4,792,958). The laser array 200 is formed in a manner very similar to the laser array 100. First the epitaxial layers 22, 24, 26, 28, 30, 32, 34, 36, and 38 are grown on the substrate 20, the ribs 40a and 40b are then defined by etching, and the n-type blocking layer 148 is grown. However, unlike with the laser array 100, the rib etch mask is completely removed and the contact layer 240 is uniformly grown over both ribs. An isolation groove 246 is then formed through the layers 240, 148, 32, 30, 28, 26, 24, and 22 and into substrate 20. Separated metal contacts 254a and 254b are then applied to the epitaxial side and a uniform metal contact 58 is applied to the substrate 20. The metal contacts 254a and 254b enable the individual addressing of each laser element. As in the laser array 100, the groove 246 may be filled with insulating material, such as polyimide, or it may be coated with a protective coating 158 of a material such as $Si_3N_4$.

This laser array 200 has the advantage over the laser arrays 10 and 100 in that the ribs 40a and 40b are protected by a layer of semiconductor material. Further, the contact resistance to the laser elements is substantially reduced due to the increased contact area between the metallic contacts 254a and 254b and the underlying semiconductor layer. However, the laser array 200 requires 3 epitaxial growths, and will therefore be more costly and will probably result in a lower yield.

The previously described embodiments may be modified for more than two laser emitters on a single chip. However, a problem with laser arrays having more than two laser elements is the need to isolate the contacts that address the individual laser emitters. In many cases, it is extremely important that undesired electrical or thermal interaction between the elements be kept low. Isolation is particularly important where the contact for an inner laser element crosses over another laser element. Furthermore, isolation is especially difficult when crossing over grooves.

Figure 4:
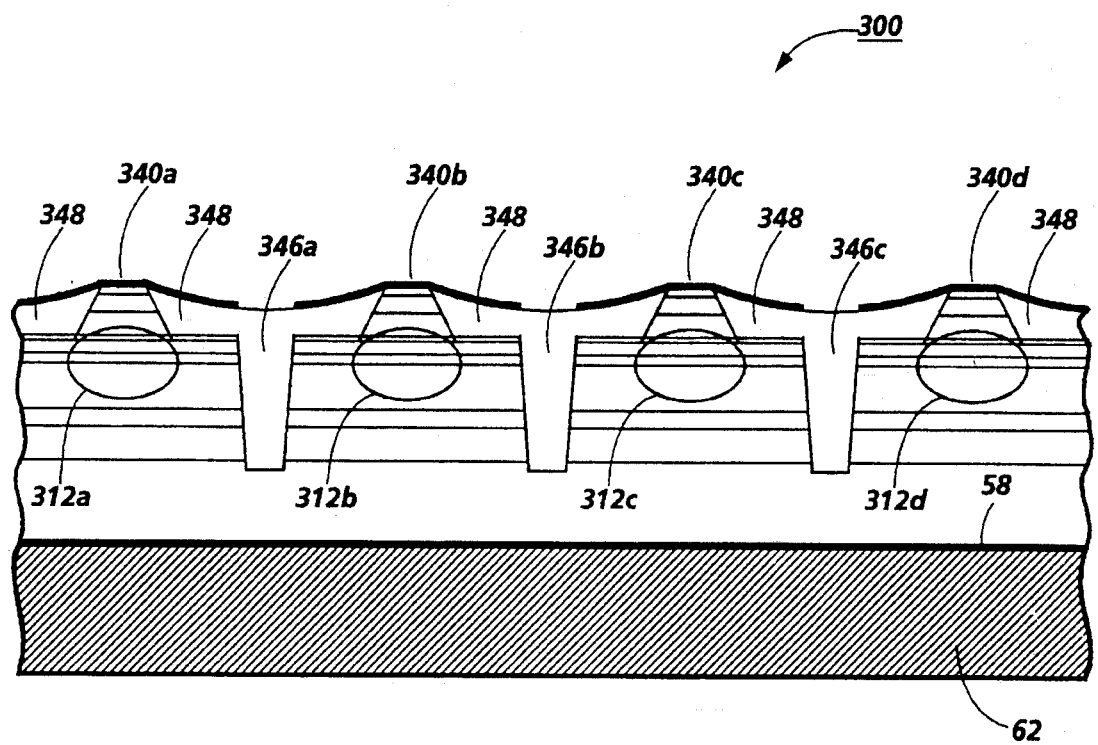
FIG. 4 shows a cross-sectional view of a fourth embodiment laser array having four laser elements.

FIG. 4 shows a multiple laser array 300 that substantially overcomes the isolation problems in laser arrays with more than two elements. As illustrated, the laser array 300 has four laser elements 312a, 312b, 312c, and 312d. Each laser element is substantially the same as the laser elements in the laser array 10 (see FIG. 1). To form the laser array 300, the epitaxial layer structures are grown as described above, as are the ribs 340a, 340b, 340c, and 340d (by etching). Grooves 346a, 346b, and 346c are then formed between the laser elements, either by reactive ion etching or by wet chemical etching. An Insulating layer 348 is then formed over the entire structure, and windows are opened in the layer 348 above ribs 340a, 340b, 340c, and 340d. The layer 348 is deposited such that the grooves 346a, 346b, and 346c are filled in. A special electrical contact pattern is then formed over the structure.

Figure 5:
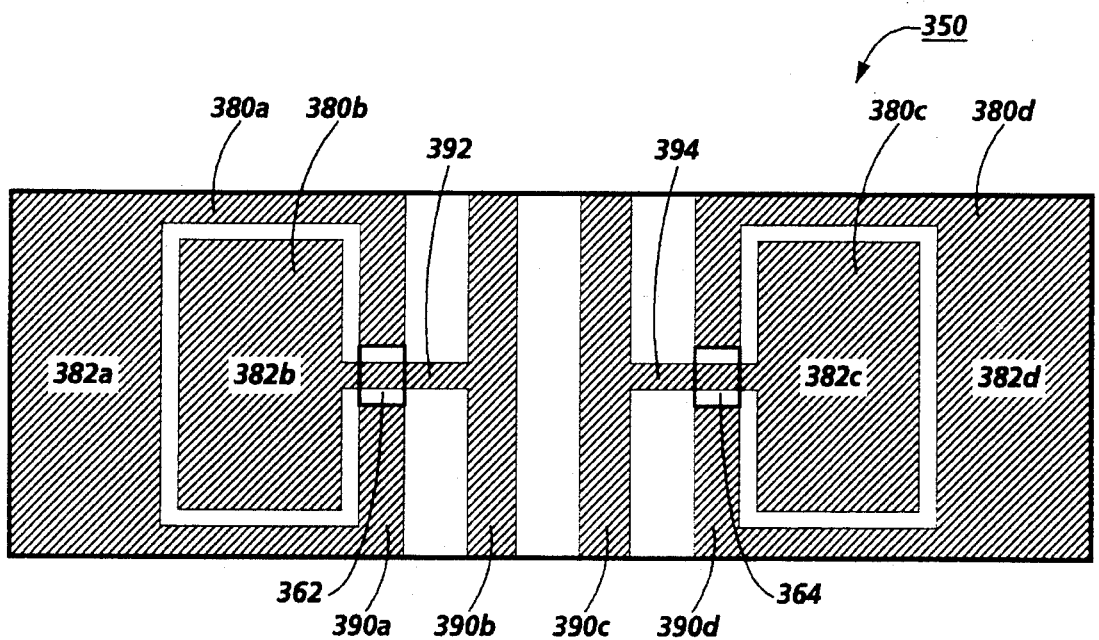
FIG. 5 is a plan view of the laser array shown in FIG. 4, specifically showing the metal contact geometry for independently contacting the four laser elements.

The special electrical contact pattern enables independent addressing of each laser element. A preferred special electrical contact pattern (disclosed in U.S. Pat. No. 4,870,652 to Thornton, and hereby incorporated by reference) is shown in FIG. 5. Of course, other patterns are possible. FIG. 5 shows the top view of the multiple laser array 300 with a special electrical contact pattern 350 depicted by crosshatching. As shown, the pattern 350 includes metal at cross-over regions 362 and 364. To assist in forming the cross-over portions, the etching mask is not removed from the tops of the ribs in the crossover regions 362 and 364. The pattern 350 (including cross-over regions) is formed by metallizing through a liftoff mask, for example, with a Cr-Au bilayer.

As the insulating layer 348 has filled in the grooves 346a, 346b, and 346c, the top surface of the insulating layer is substantially planar. This allows the accurate and continuous formation of the metallization pattern 350 over the ribs 340a, 340b, 340c and 340d, and the grooves 346a and 346c. The metallization pattern includes four contacts 380a, 380b, 380c, and 380d, one for each of the respective laser elements 312a, 312b, 312c, and 312d. The contacts 380a, 380b, 380c, and 380d have bonding pads 382a, 382b, 382c, and 382d, respectively, for attachment of separate wires. The outer bonding pads 382a and 382d connect to bifurcated stripes 390a and 390d, respectively. The inner bonding pads 382b and 382c connect, respectively, to contact stripes 390b and 390c via metal connection bridges 392 and 394. The connection bridges 392 and 394 lie on insulating crossovers 362 and 364, thereby isolating contacts 380b and 380c from laser elements 312a and 312d. After the patterned contact metallization is formed on the epitaxial side, the front and rear laser facets are coated and the laser array is packaged with its substrate attached to the mount 62. Wires are then attached to the exposed bonding pads 382a, 382b, 382c, and 382d.

Laser arrays having more than two elements can also be made using the technique described above with other laser elements, including those shown in FIGS. 2A, 2B and 3.

It is to be understood that the above described embodiments are illustrative examples which incorporate the present invention. Those embodiments are intended to be instructive, not limiting.

What is claimed:

1. A monolithic laser array, comprising, a semiconductor substrate having first and second surfaces;

a multilayer structure having third and fourth surfaces, and wherein said third surface is disposed on said second surface of said substrate, said multilayer structure including a first semiconductor optical confinement layer having the same conductivity type as said substrate, and a second semiconductor optical confinement layer having the opposing conductivity type, said multilayer structure further including at least two active semiconductor regions for generating and propagating lasing light, each of said said active regions being intervenient to said first and second semiconductor confinement layers and having a smaller bandgap than said first and second confinement layers, and each of said active regions operating at substantially the same wavelength;

a plurality of lateral optical waveguides in at least one layer of said multilayer structure;

an optical resonator for at least two of said plurality of lateral optical waveguides;

a plurality of addressing electrodes on said fourth surface, each addressing electrode being associated with one of said optical waveguides;

an isolation groove between two of said optical waveguides and that extends from said fourth surface through said active layer, wherein said isolation groove includes a thermally and electrically insulating layer extending into said groove such that said optical waveguides are thermally and electrically isolated from each other; and a common electrode on said first surface of said substrate, said common electrode for cooperating with each of said addressing electrodes to enable current flow through the optical waveguide associated with each addressing electrode.

2. The laser array according to claim 1 wherein said optical waveguides are each at least partially defined by a protruding striped mesa region that includes a layer of said multilayer structure.

3. A monolithic laser array according to claim 2, wherein said multilayer structure includes an etch stop layer from which said mesa region protrudes.

4. A monolithic laser array according to claim 1, wherein the insulating layer substantially fills said groove.

5. A monolithic laser array, comprising, a semiconductor substrate having first and second surfaces;

a multilayer structure having third and fourth surfaces, said third surface on said second surface of said substrate, said multilayer structure including a first semiconductor optical confinement layer having the same conductivity type as said substrate, and a second semiconductor optical confinement layer having the opposing conductivity type, said multilayer structure further including an active semiconductor layer for generating and propagating lasing light, said active layer being intervenient to said first and second semiconductor confinement layers and having a smaller bandgap than said first and second confinement layers;

a plurality of lateral optical waveguides in at least one layer of said multilayer structure;

an optical resonator for at least two of said plurality of lateral optical waveguides;

a plurality of addressing electrodes on said fourth surface, each addressing electrode having a thermally isolated free surface and each being associated with one of said optical waveguides;

an isolation groove between two of said optical waveguides and that extends from said fourth surface through said active layer, said isolation groove including a thermally and electrically insulating layer extending into said groove; and a common electrode on said first surface of said substrate, said common electrode for cooperating with each of said addressing electrodes to enable current flow through the optical waveguide associated with each addressing electrode.

6. A monolithic laser array according to claim 5, wherein the insulating layer substantially fills said groove.

7. A monolithic laser array, comprising, a semiconductor substrate having first and second surfaces;

a multilayer structure having third and fourth surfaces, said third surface on said second surface of said substrate, said multilayer structure including a first semiconductor optical confinement layer having the same conductivity type as said substrate, and a second semiconductor optical confinement layer having the opposing conductivity type, said multilayer structure further including an active semiconductor layer for generating and propagating lasing light, said active layer being intervenient to said first and second semiconductor confinement layers and having a smaller bandgap than said first and second confinement layers;

plurality of lateral optical waveguides in at least one layer of said multilayer structure, wherein said optical waveguides are each at least partially defined by a protruding striped mesa region that includes a layer of said multilayer structure;

an optical resonator for at least two of said plurality of lateral optical waveguides;

a plurality of addressing electrodes on said fourth surface, each addressing electrode having a thermally isolated free surface and each being associated with one of said optical waveguides;

an isolation groove between two of said optical waveguides and that extends from said fourth surface through said active layer, said isolation groove including a thermally and electrically insulating layer extending into said groove; and, a common electrode on said first surface of said substrate, said common electrode for cooperating with each of said addressing electrodes to enable current flow through the optical waveguide associated with each addressing electrode.

8. The laser array according to claim 7, wherein said multilayer structure includes an etch stop layer from which said mesa region protrudes.

9. A monolithic laser array according to claim 8, further including a blocking layer which forms a P-N junction with said etch stop layer.

10. A monolithic laser array, comprising, a semiconductor substrate having first and second surfaces, wherein said first surface is non-segmented;

a multilayer structure having third and fourth surfaces, and wherein said third surface is disposed on said second surface of said substrate, said multilayer structure including a first semiconductor optical confinement layer having the same conductivity type as said substrate, and a second semiconductor optical confinement layer having the opposing conductivity type, said multilayer structure further including an active semiconductor layer for generating and propagating lasing light, said active layer being intervenient to said first and second semiconductor confinement layers and having a smaller bandgap than said first and second confinement layers;

a plurality of lateral optical waveguides in at least one layer of said multilayer structure;

an optical resonator for at least two of said plurality of lateral optical waveguides;

a plurality of addressing electrodes on said fourth surface, each addressing electrode being associated with one of said optical waveguides;

an isolation groove between two of said optical waveguides and that extends from said fourth surface through said active layer, wherein said isolation groove includes a thermally and electrically insulating layer extending into said groove such that said optical waveguides are thermally and electrically isolated from each other;

a common electrode on said first surface of said substrate, said common electrode for cooperating with each of said addressing electrodes to enable current flow through the optical waveguide associated with each addressing electrode; and a package having a mounting surface, said first surface of said semiconductor substrate attached to said mounting surface.

11. A monolithic laser array according to claim 10, wherein the insulating layer substantially fills said groove.

* * * * *